United States Patent [19]

Harder et al.

[11] Patent Number: 5,059,552

[45] Date of Patent: Oct. 22, 1991

[54] PROCESS FOR FORMING THE RIDGE STRUCTURE OF A SELF-ALIGNED SEMICONDUCTOR LASER

[75] Inventors: Christoph S. Harder, Zurich; Wilhelm Heuberger, Richterswil, both of Switzerland; Peter D. Hoh, Hopewell Junction, N.Y.; David J. Webb, Rüschlikon, Switzerland

[73] Assignee: International Business Machines Corporation, Armonk, N.Y.

[21] Appl. No.: 669,816

[22] Filed: Mar. 15, 1991

[30] Foreign Application Priority Data

Apr. 6, 1990 [EP] European Pat. Off. .......... 90810279

[51] Int. Cl.$^5$ .................... H01L 21/20; H01R 21/20
[52] U.S. Cl. ................................. 437/129; 437/133; 437/234; 437/184; 437/245; 148/DIG. 100
[58] Field of Search .............. 437/129, 126, 133, 234, 437/944, 23; 148/DIG. 95, DIG. 100

[56] References Cited

U.S. PATENT DOCUMENTS

| | | | |
|---|---|---|---|
| 3,961,996 | 6/1976 | Namizaki et al. | 437/133 |
| 4,276,098 | 6/1981 | Nelson et al. | 437/133 |
| 4,566,171 | 1/1986 | Nelson et al. | 437/133 |
| 4,933,302 | 6/1990 | Costrini et al. | 437/133 |
| 4,940,672 | 7/1990 | Zavracky | 437/129 |
| 4,948,753 | 8/1990 | Yoshikawa et al. | 437/133 |
| 4,987,097 | 1/1991 | Mitta et al. | 437/129 |
| 4,994,143 | 2/1991 | Kim | 437/133 |

Primary Examiner—Brian E. Hearn
Assistant Examiner—Michael Trinh
Attorney, Agent, or Firm—Richard A. Romanchik

[57] ABSTRACT

A process for forming the ridge structure of a self-aligned InP-system, double heterostructure (DH) laser, particularly useful for long wavelength devices as required for signal transmission systems includes a thin $Si_3N_4$ layer (41) inserted between a photoresist mask (42) that defines the ridge structure, and a contact layer (35). Using a $Si_3N_4$ layer (4) deposited at a high plasma excitation frequency (RF) for adhesion promotion, and a low frequency deposited (LF) $Si_3N_4$ layer (43) for device embedding, provides for the etch selectively required in the process step that is used to expose the contact layer to ohmic contact metallization deposition.

8 Claims, 2 Drawing Sheets

PROCESS FOR FORMING THE RIDGE STRUCTURE OF A SELF-ALIGNED SEMICONDUCTOR LASER

TECHNICAL FIELD

The invention concerns a process for forming the ridge structure of a self-aligned III/V compound semiconductor double heterostructure (DH) laser device. More particularly, it relates to a long wavelength laser device as required for signal communication systems and which may be designed in an Indium Phosphide (InP) system.

BACKGROUND OF THE INVENTION

Semiconductor laser diodes have found applications in a wide variety of information handling systems, partly because of their compact size and partly because their technology is compatible with associated circuitry and other electro-optical elements. They are being used in areas such as data communication, optical storage and optical beam printing.

An extensive range of different laser structures has been suggested and is being used. One of the fundamentally simplest and most reliable laser devices available today is the self-aligned ridge laser. One such laser and its fabrication process has been described in an article "High Power Ridge-Waveguide AlGaAs GRINSCH Laser Diode" by C. Harder et al (published in Electronics Letters, 25th September 1986, Vol. 22, No. 20, pp. 1081–82).

In the past, most of the efforts made in designing semiconductor lasers were directed to GaAs-system devices operating at a wavelength of about 0.8 μm. However, particularly for communications applications, lasers emitting beams of longer wavelength (in the order of 1.3 μm) are also in great demand since they better match the transmission characteristics of the optical fiber links often used. An extensive survey on such structures, including ridge waveguide lasers, and their performance is given in chapter 5 of a book entitled "Long-Wavelength Semiconductor Lasers" by G. P. Agrawal and N. K. Dutta (Van Nostrand Reinhold Company, NY).

In the fabrication of self-aligned ridge laser structures, normally a single photolithographic mask is used to define the entire contact/ridge geometry area throughout the whole ridge formation process. However, problems arise when this process is applied to long-wavelength, InP-system lasers. Severe undercutting during etching occurs at the photoresist/GaInAs contact interface which significantly reduces the ohmic contact area whereby the overall contact resistance is increased. This, in turn, leads to increased heating of the laser with a negative impact on device properties.

A number of authors have investigated the reasons for and the consequences of the photoresist etch mask undercut problem. Some of their articles are given below:

"Preferential Etching of InP Through Photoresist Masks" by D. T. C. Hus et al (J. Electrochem.Soc.: Solid-State Science and Technology, Vol. 135, No. 9, pp. 2334–2338);

"Performance of an improved InGaAsP Ridge Waveguide Laser at 1.3 μm" by I. P. Kaminow et al (Electronic Letters, 30th April 1981, Vol. 17, No. 9, pp. 318–320);

"On the Formation of Planar-Etched Facets in GaInAsP/InP Double Heterostructures" by L. A. Coldren et al (J. Electrochem.Soc.: Solid State Science and Technology, Vol. 130, No. 9, pp. 1918–1926).

It has been found that the problem of underetching is at least partly due to inefficient adhesion of the photoresist mask to the contact layer. Although a variety of adhesion promotion techniques are known in semiconductor technologies (ranging from the use of adhesion promotion films, special mask treatments or materials, to the use of specific etchants or etch processes), they have not yet led to a satisfactory solution for the fabrication of long wavelength ridge waveguide lasers. The overall task of providing a simple, workable and reproducible ridge formation process offering an adequate "process window" for realistic fabrication tolerances, is furthermore complicated in that, in the sequence of the process steps using the same photoresist mask, a sufficient etch selectivity, (i.e., the selective controlled removal of one material over the other), needs to be achieved to allow the fabrication of the required ridge profile. The problem is not so much to find solutions for each of the specific problems, but to provide an overall concept that solves the problems, that are not isolated from each other, as a whole. To our knowledge, no process satisfying the numerous requirements has yet been presented.

SUMMARY OF THE INVENTION

An object of the present invention is to provide a predictable and reproducible process involving simple, conventional process steps, for the fabrication of high performance, long wavelength ridge waveguide lasers.

Another object is to provide a process for fabricating a ridge waveguide laser in an InP material system that substantially eliminates undercutting at the mask/contact layer interface thereby decreasing device resistance and heat development and improving device properties.

A further object is to provide a process for the formation of a ridge structure that allows for low ohmic contact resistance and for effective lateral waveguiding.

The invention as claimed is intended to meet these objectives and to remedy the deficiencies of known processes used for laser ridge structure formation. With the inventive self-aligned process this is accomplished in that a single photoresist mask is used in the successive selective etch steps that are required for (1) the definition of the ridge position and area, (2) the ohmic contact via formation (involving the use of an adhesion promotion layer), (3) the ridge waveguide formation, and (4) the electrical device isolation.

The main advantage provided by the inventive process is that it allows the reliable and simple fabrication of long wavelength laser ridge structures, the process offering a sufficiently large process window for realistic process and material tolerances. The process avoids the described negative effects caused by severe and partly uncontrolled underetching and fulfills the critical etch selectivity requirements throughout the process.

FIG's. 4A–4B are side views of the structures fabricated by the steps of the present inventive process.

BEST MODE FOR CARRYING OUT THE INVENTION

Before describing an embodiment of the inventive ridge formation process, a brief outline of a typical, known III/V compound semiconductor ridge laser structure which may be fabricated using the process, is given.

Figure 1:
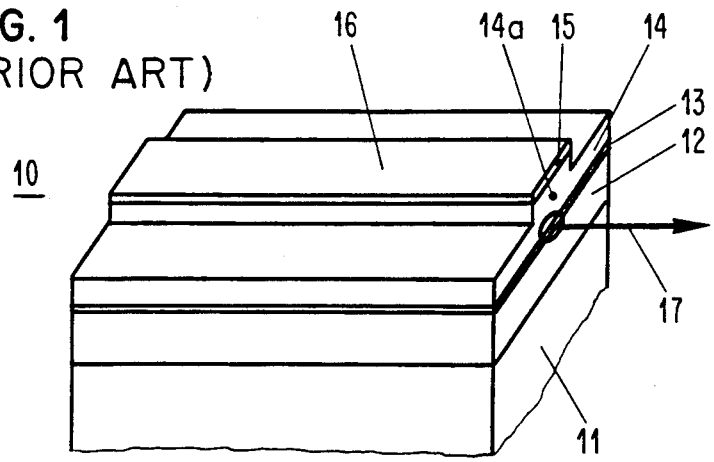
FIG. 1 is a generalized, schematic perspective view of a prior art ridge waveguide laser structure.

FIG. 1 is a perspective view of a known ridge laser structure 10 of which only the major elements are shown. the layered structure, grown on a substrate 11, includes at least the active layer 13 sandwiched between cladding layers 12 and 14. The drawing shows the structure after completion of the process steps required to form the waveguide ridge 16 which comprises a contact layer 15 and the ridge part 14a of the upper cladding layer 14. Not shown in the drawing are the insulation layer embedding the sidewalls of the ridge and covering the surface of the upper cladding layer 14, and the metallization layers providing for the electrical contacts to the completed device.

When the device is activated by applying proper operating voltages, a light beam 17 is emitted. In the drawing, the light mode region of the laser is shown as a small ellipse centering around the active layer 13 and laterally defined by the stripe ridge 16.

The purpose of the present invention is to provide a process for forming the ridge structure of such laser devices. Although the invention is particularly advantageous for long wavelength lasers (wavelength of about 1.3 to 1.5 $\mu$m) it is, also applicable to devices emitting shorter wavelength beams (e.g. 0.8 $\mu$m or less). For the embodiment that will be described below, an InP-system laser structure has been chosen as it is often employed for long wavelength communication applications. The process is, however, not only suitable for InP lasers but also for other group III/V compound structures.

Figure 2A:
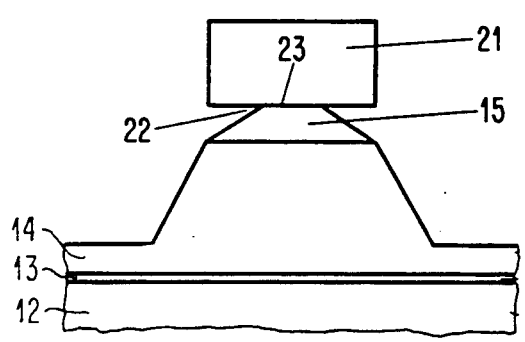
FIG. 2A is a side view of a prior art ridge waveguide laser structure.

One of the key problems in forming the ridge structure of ridge waveguide lasers is caused by the undercut that occurs when etching the contact layer to the desired width by employing a photoresist mask. FIG. 2A illustrates resulting from conventional manufacturing methods undesirable undercut profiles for InP system lasers. Reference to this figure is also made in the following description of a known process used for the formation of the ridge.

The starting point for manufacturing InP lasers is a stack of epitaxially grown layers such as the one illustrated FIG. 1, the ridge structure not being etched yet. The stack includes InP cladding layers 12 and 14 with the active GaInAsP layer 13 sandwiched in between, and the GaInAs contact layer 15, initially covering the whole top surface of the upper cladding layer 14. Then, a photoresist layer is applied and patterned to provide the mask 21 for ridge definition. Mainly due to poor adhesion between the photoresist and the InGaAs, one has an imperfect interface between the mask 21 and the contact layer 15. During the next step, which is the chemical etching of the contact layer, the poor adhesion causes severe etch undercutting due to preferential etching of the native oxide which, in turn, reveals a fresh InP surface that etches more rapidly. Since this etch process is not dominated by crystallographic properties but rather by preferential interface etching, a non-crystallographic etch angle of about 30° is obtained leading to the large undercut denoted 22 in the figure. In a subsequent etch step, using the same photoresist mask 21, the upper cladding layer 14 is patterned to the shape illustrated, the crystallographic etch angle being about 55°.

This contact etch step is critical since the undercut reduces the area 23 to which the ohmic contact is made in a later process step. The contact resistance of the laser degrades with decreasing area, which causes heating of the device and has a severe negative impact on device performance. It should be noted that widening of the ridge, a measure that would obviously increase the contact area 23, is not feasible since this would seriously affect the waveguiding properties of the ridge structure.

Figure 2B:
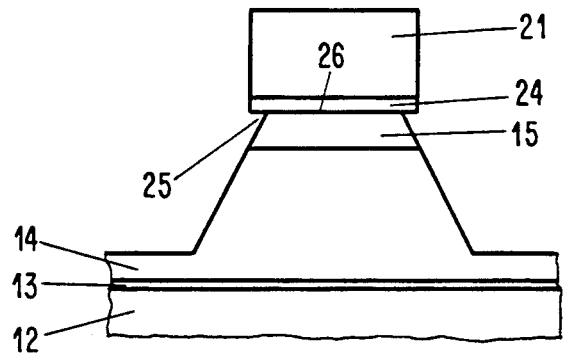
FIG. 2B is a side view of a ridge waveguide laser structure fabricated using the present inventive process.

The principle of the inventive process and the ridge shape obtained therewith are schematically shown in FIG. 2B.

The starting point for the process of the present invention is again an InP-system layered structure with a sandwich formed by the lower cladding (12)—active (13)—upper cladding (14) layers and with a still unpatterned GaInAs contact layer 15 on top. To protect the GaInAs contact 15 from undercutting during the chemical etch process, a thin layer 24 of a passivating dielectric material is deposited before the photoresist is applied and patterned, to provide the etch mask 21. The passivating material is selected from the oxides and nitrides of silicon and mixtures thereof. These materials include silicon dioxide ($SiO_2$), silicon nitride ($Si_3N_4$) and silicon oxynitrides ($SiO_xN_y$) where any desired film composition between $SiO_2$ and $Si_3N_4$ may be obtained by controlling the film forming reactants. This material will hereafter be referred to as silicon oxynitride. The silicon oxynitride forms a near perfect interface with the contact material and substantially eliminates preferential etching. As a result, the etch angle is determined by crystallographic properties. The undercut 25 is thereby effectively reduced and the contact area 26 increased. As with the above outlined conventional process, the formation of the ridge structure is completed by subsequently etching the upper cladding layer 14 to the desired depth.

The improvement achieved becomes apparent when comparing FIGS. 2A and 2B, the former showing the contact etched with only the photoresist pattern, the latter showing the contact formed by using the new method that provides for an improved interface through the use of the silicon oxynitride layer 24. The improvement to be noted is the change in etch angle that the contact layer 15 has with respect to the ridge profile. The etch angle obtained with the silicon oxynitride layer 24 (FIG. 2B) is about 55° while the etch angle without (FIG. 2A) is approximately 30°. As a result, the contact area 26 for the prevent invention is substantially larger than the contact area 23 in the prior art.

Figure 3:
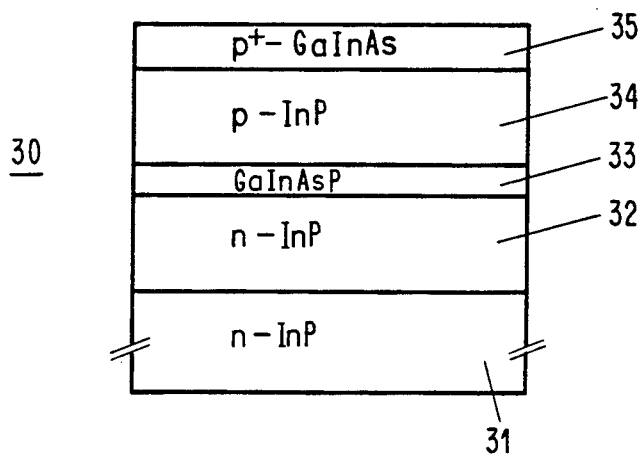
FIG. 3 is a schematic side view of a basic layered laser structure.

Now, an embodiment of the inventive process for the fabrication of laser ridge structures will be outlined in detail. The basic layered structure 30 from which the ridge structure will be formed is schematically shown in FIG. 3. The layer sequence is epitaxially grown using a Low Pressure Metal Organic Vapor Phase Epitaxy (LP-MOVPE) process. It is grown on an InP wafer 31 and consists of a GaInAsP Double Heterostructure (DH) 33 embedded between n- and p-doped InP cladding layers 32 and 34. The structure is completed by the growth of a heavily p-doped GaInAs contact layer 35.

In the example chosen, the InP wafer was S-doped ($n=6\times10^{18}cm^{-3}$), the lower InP cladding layer 32 homogeneously Si-doped ($n=10^{18}cm^{-3}$) and 1.4 μm thick, undoped active GaInAsP layer 33 had a thickness of 0.165 μm, the emission maximum was measured to be at a wavelength very close to 1.3 μm. The upper cladding layer 34 was Zn-doped ($p=10^{18}cm^{-3}$) and the low bandgap p-GaInAs cap or contact layer 35 was doped to the solubility limit of $2\times10^{19}cm^{-3}$ near the surface to provide for optimum conditions for a low resistivity ohmic contact.

In the example herein described, the layer structure of FIG. 3 is used as the basic laser structure to which the inventive ridge formation process can be applied. This process will now be described with the aid of FIGS. 4A to 4I, which illustrate the successive steps of the process. Table 1 lists the correspondence between the steps and FIGS. 4A-4I. The table is also used to illustrate the importance and complexity of the required etch selectivity requirements throughout the process. For this purpose, the two "Selective Removal" columns headed YES and NO, respectively, indicate for each removal or etch step which layers or materials are to be etched and which are to be affected as little as possible. Also in the example herein described, $Si_3N_4$ will be utilized as the aforementioned silicon oxynitride.

TABLE I

| FIG. | Step No. | Description of Process Step | Selective Yes | Removal No |
|---|---|---|---|---|
| 4A | | Starting point: Epitaxially grown layered laser structure (FIG. 3) | | |
| 4B | 1 | Deposition of RF $SiN_x$ layer (41) | | |
| 4C | 2 | Deposition and patterning of photoresist (PR) ridge mask (42) | PR | $SiN_x$ |
| 4D | 3 | RIE etching of RF $SiN_x$ layer (41) | $SiN_x$ | GaInAs |
| 4E | 4 | Chemical etching of contact layer (35) | GaInAs | InP RF $SiN_x$ |
| 4F | 5 | Chemical etching of cladding layer (34) | InP | GaInAs |
| 4G | 6 | Deposition of conformal LF $SiN_x$ | | layer (43) |
| 4H | 7 | Lift-off PR mask with covering LF $SiN_x$ layer (42, 43) | RF | LF $SiN_x$ |
| 4I | 8 | Removal of RF SiNs; bx layer (41) | RF $SiN_x$ | LF $SiN_x$ |

Basically, the process allows the fabrication of fully self-aligned ridge lasers. The self-alignment process has the advantage of reducing the number of critical alignment steps. This is accomplished by utilizing a single photolithographic mask for all the following process steps, namely (1) ridge definition (FIG. 4C), (2) ohmic contact via formation (FIG. 4D & E), (3) ridge waveguide formation (FIG. 4F), and (4) electrical isolation (FIG. 4G).

Figure 4A:
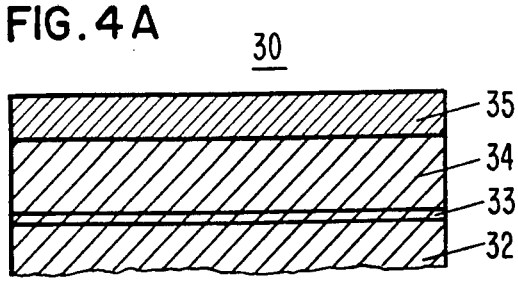

Referring now to FIG. 4A, the ridge formation process is initiated starting from the layer sequence 30 shown in FIG. 3.

Figure 4B:
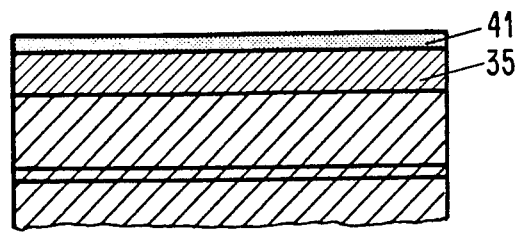

In step 1 of the process, illustrated in FIG. 4B, the GaInAs contact layer 35 is covered with a continuous layer 41 of silicon nitride $Si_3N_4$ of 100 nm thickness deposited in a Plasma Enhanced Chemical Vapor Deposition (PECVD) process at a plasma excitation frequency RF of 14.56 MHz with an ammonia (NH3) addition. This dielectric layer serves to enhance the adhesion at the mask/contact layer interface.

Figure 4C:
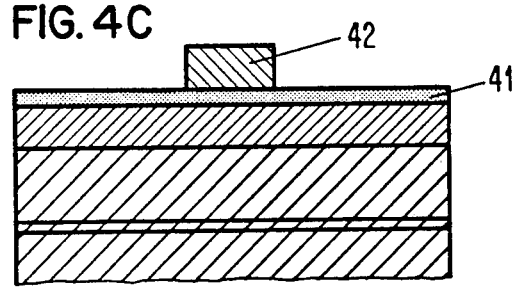

Next, in step 2, photoresist 42 is applied and patterned as shown in FIG. 4C to define the ridge area. Ridges are aligned depending on the crystal orientation of the substrate to yield a gently sloped ridge sidewall. In the example described, the ridges were chosen to run in the (110) direction. The only critical alignment in the sequence of process steps occurs at this step, the photoresist (PR) mask 42 being used in all subsequent self-alignment steps of the ridge formation process.

Figure 4D:
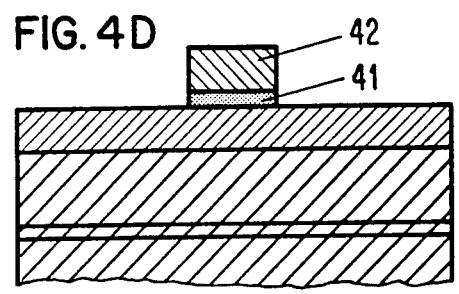

In the following step 3, the $Si_3N_4$ layer 41 is etched in a $CF_4$ Reactive Ion Etch (RIE) process using photoresist 42 as a mask as shown in FIG. 4D.

Figure 4E:
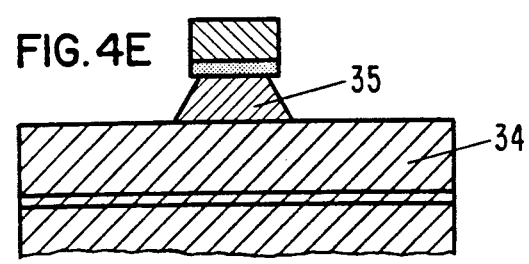

Then, in step 4, the GaInAs contact layer 35 is chemically wet-etched with a GaAs etchant of Sulfuric Acid, Hydrogen Peroxide and water. This etchant is highly selective with InP and after the GaInAs contact is removed as shown in FIG. 4E, etching stops at the surface of the InP cladding layer 34.

Figure 4F:
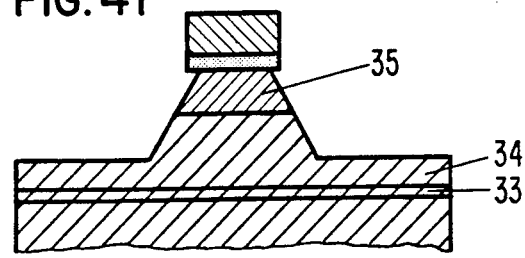
Figure 4G:
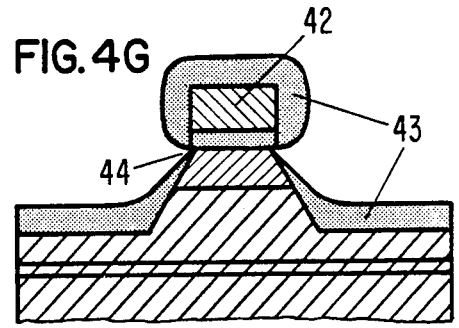
Figure 4H:
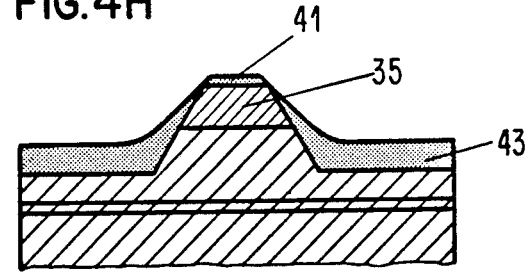

The formation of the optical waveguide continues with the etching of the InP cladding layer 34 as illustrated in FIG. 4F. In this step, Hydrogen Bromide/Acetic Acid is selected to etch InP without etching the previously etched contact material GaInAs (35) any further. To control the etch rate, the etchant is cooled to approximately 5° C., thereby reducing the etch rate to about 11 nm/second. Etching is stopped 0.10 to 0.15 μm above the cladding (34)/active layer (33) interface.

FIG. 4G illustrates step 6, the isotropic deposition of a second $Si_3N_4$ layer 43 of 150 nm thickness, which serves to embed the structure with a conformal insulator to electrically isolate exposed, unprotected areas from the subsequent metal deposition needed as bonding pads for packaging. This step employs another PECVD process which results, firstly, in a very conformal $Si_3N_4$ film deposition covering any sharp topography or large steps and which, secondly, provides for a desirable thin, potentially non-continuous coverage in the undercut areas 44. This is important for a subsequent lift-off process. The embedding insulation $Si_3N_4$ film 43 is deposited at a low frequency (LF) of about 50 kHz. This LF nitride is deposited without ammonia (NH3) in the plasma so the hydrogen content of the film is greatly reduced. Consequently, the etch rate of the film in buffered hydro fluoric acid (BHF) is reduced. This is important for the etch selectivity required in a subsequent processing step.

Figure 4I:
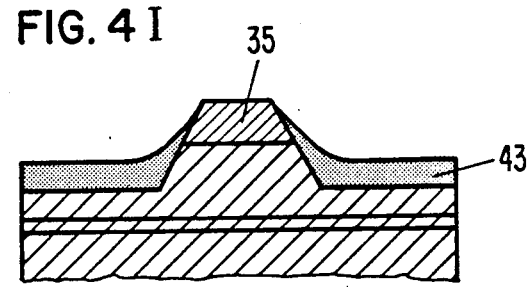

The next two steps, 7 and 8, serve to remove the photoresist mask 42 together with the overlying LF $Si_3N_4$ (FIG. 4H) as well as the RF $Si_3N_4$ 41 covering the GaInAs contact 35 in order to expose the contact region to subsequent ohmic contact metal deposition (FIG. 4I). First, the photoresist mask 42 is removed in step 7 in a solvent such as N-methyl pyrilodone (NMP) at elevated temperatures, followed by acetone and propanol baths with ultrasonic agitation. In step 8, after the removal of the majority of the photoresist, the sample is dipped for 1 to 2 seconds in a 7:1 BHF solution to remove the RF $Si_3N_4$ 41 that was used as a adhesion promoter. This also opens any residual photoresist to attack by a following Acetone treatment. The LF $Si_3N_4$ embedding 43 deposited at low frequency without NH3 is only very slightly etched at the given BHF concentration. In other words, the faster etching RF $Si_3N_4$ 41 is selectively removed to open the contact region while the slower etching LF $Si_3N_4$ 43 insulating film remains intact.

Thereafter, conventional processes can be used to complete the laser device by depositing metallization layers to form ohmic p- and n-contacts, by applying reflectivity coatings, etc. Since these steps are not part of the ridge formation process, they are not described in detail herein.

From the above process description, the importance of the adhesion promotion obtained with the additional $Si_3N_4$ layer and also the significance of the etch selectivity throughout the whole process is apparent. Using this process, high performance ridge lasers may be fabricated. For example, a 1.3 μm GaInAsP DH ridge laser device displays low threshold currents and threshold current densities with output powers as high as 30 mW per facet.

While the above description is primarily directed to the fabrication of a specific long wavelength InP DH laser, this embodiment is only exemplary of the inventive process. It should be noted that the thicknesses and other dimensions, the materials used as well as the process parameters given herein are selected for clarity of illustration and are not to be interpreted in a limiting sense.

For example, further enhancements and/or different device performance characteristics may be obtained by applying the process:
 to devices consisting of group III/V compound semiconductors other than the described InP-system,
 to quantum well devices rather than to devices having relatively thick active layers, or
 to devices emitting even longer wavelength beams.

Also, processes different from the described wet chemical processes for etching the contact layer and the cladding layer may be used. As an example, they may be replaced by anisotropic etch processes.

What is claimed is:

1. A process for forming a self-aligned ridge structure for a III-V compound semiconductor double heterostructure laser device, comprising the steps of:
  providing an epitaxially grown, layered heterostructure comprised of, from top to bottom: a) a contact layer; b) a first cladding layer; c) an active region for recombination and light generation; d) a second cladding layer, wherein said first and second cladding layers form a waveguide for light confinement and gain;
  depositing a first silicon oxynitride layer on top of said contact layer in a PECVD process, at a high (RF) excitation frequency;
  depositing and patterning a photoresist layer on top of said first silicon oxynitride layer for use as a mask for the definition of the ridge structure;
  reactive ion etching (RIE) said first silicon oxynitride layer, thereby leaving the section covered by said photoresist layer intact;
  selective etching said contact layer down to said first cladding layer, thereby obtaining underneath said first silicon oxynitride layer a crystallographic etch angle and a small undercut;
  selective etching said first cladding layer to a predetermined depth, leaving said contact layer substantially unaffected;
  depositing a conformal, second silicon oxynitride layer in a low (LF) exitation frequency, PECVD process, said second silicon oxynitride layer thereby having an etch rate lower than that of said first silicon oxynitride layer;
  lift-off of the part of said second silicon oxynitride layer deposited on top of said photoresist layer by dissolving said photoresist layer, thereby exposing said first silicon oxynitride layer; and
  selective removal of said first silicon oxynitride layer, thereby leaving said second silicon oxynitride layer and said contact layer substantially unaffected.

2. The process for forming a self-aligned ridge structure for a III-V compound semiconductor double heterostructure laser device according to claim 1, wherein said active layer is comprised of GaInAsP, said first and second cladding layers are comprised of InP and said contact layer is comprised of GaInAs.

3. The process for forming a self-aligned ridge structure for a III-V compound semiconductor double heterostructure laser device according to claim 1, wherein said first and said second silicon oxynitride layers are comprised of $Si_3N_4$.

4. The process for forming a self-aligned ridge structure for a III-V compound semiconductor double heterostructure laser device according to claim 3, wherein said first silicon oxynitride layer is deposited at a plasma exitation frequency on the order of 1 MHz higher than the plasma exitation frequency at which said second silicon oxynitride layer is applied.

5. The process for forming a self-aligned ridge structure for a III-V compound semiconductor double heterostructure laser device according to claim 1, wherein said first silicon oxynitride layer is deposited using a Plasma Enhanced Chemical Vapor Deposition (PECVD) process at a plasma exitation frequency higher than 1 MHz and with an ammonia ($NH_3$) addition to the plasma, and said second silicon oxynitride layer is deposited using a PECVD process at a plasma exitation frequency lower than 100 kHz without an ammonia ($NH_3$) addition to the plasma.

6. The process for forming a self-aligned ridge structure for a III-V compound semiconductor double heterostructure laser device according to claim 1, wherein said first silicon oxynitride layer is selectively removed in a Buffered Hydro Fluoric (BHF) solution which does not substantially affect said second silicon oxynitride layer.

7. The process for forming a self-aligned ridge structure for a III-V compound semiconductor double heterostructure laser device according to claim 1, wherein said photoresist layer runs in the (110) direction of the substrate.

8. The process for forming a self-aligned ridge structure for a III-V compound semiconductor double heterostructure laser device according to claim 1, wherein the wavelength of light in said active layer is on the order of 1.3 μm.

* * * * *